(12) United States Patent
Szawarski et al.

(10) Patent No.: US 10,598,737 B2
(45) Date of Patent: Mar. 24, 2020

(54) DC-DC SWITCHING POWER SUPPLY LOAD TESTER

(71) Applicant: DENSO International America, Inc., Southfield, MI (US)

(72) Inventors: Tom Szawarski, Lake Orion, MI (US); Grant Porter, Livonia, MI (US)

(73) Assignee: DENSO Intetnational America, Inc., Southfield, MI (US)

( * ) Notice: Subject to any disclaimer, the term of this patent is extended or adjusted under 35 U.S.C. 154(b) by 301 days.

(21) Appl. No.: 15/723,718

(22) Filed: Oct. 3, 2017

(65) Prior Publication Data
US 2019/0101599 A1    Apr. 4, 2019

(51) Int. Cl.
*G01R 31/40*    (2020.01)

(52) U.S. Cl.
CPC .................... *G01R 31/40* (2013.01)

(58) Field of Classification Search
CPC ...................................................... G01R 31/40
See application file for complete search history.

(56) References Cited

U.S. PATENT DOCUMENTS

| | | | | |
|---|---|---|---|---|
| 5,426,579 A * | 6/1995 | Paul | ............................ | G05F 1/70 323/229 |
| 5,583,440 A * | 12/1996 | Bisher | ...................... | G01R 31/40 324/426 |
| 7,919,958 B2 * | 4/2011 | Oettinger | ............... | H02M 3/157 323/283 |
| 8,450,878 B2 * | 5/2013 | Rada | .......................... | G05F 1/70 307/105 |
| 2003/0052658 A1 * | 3/2003 | Baretich | .................. | G05F 1/613 323/284 |
| 2005/0134248 A1 | 6/2005 | Locker et al. | | |
| 2007/0002518 A1 * | 1/2007 | Wilk | ....................... | H01G 9/008 361/272 |
| 2015/0040985 A1 * | 2/2015 | Roberge | .................. | F17C 13/04 137/1 |
| 2016/0240298 A1 * | 8/2016 | Troy | ...................... | H01F 7/0257 |
| 2017/0117813 A1 * | 4/2017 | Lee | .......................... | G01R 31/40 |
| 2018/0054119 A1 * | 2/2018 | Cho | ........................ | H05K 3/303 |

\* cited by examiner

*Primary Examiner* — Christopher P McAndrew
*Assistant Examiner* — Zannatul Ferdous
(74) *Attorney, Agent, or Firm* — Harness, Dickey & Pierce, P.L.C.

(57) ABSTRACT

A device for testing a power supply. The device includes a modulation generator, and a connection between the modulation generator and the power supply under test through which a load is injected to the power supply under test. A resistive load generator applies a resistive load to the power supply. A reactive load generator applies a reactive load to the power supply. A load selector selectively applies the resistive load and/or the reactive load to the power supply to be tested. The device further includes a discharge network that automatically or manually discharges capacitors of the device.

20 Claims, 2 Drawing Sheets

DC-DC SWITCHING POWER SUPPLY LOAD TESTER

FIELD

The present disclosure relates to a DC-DC switching power supply load tester.

BACKGROUND

This section provides background information related to the present disclosure, which is not necessarily prior art.

Current technologies for testing the robustness of power supply designs induce only a resistive load to the system. While current testing technologies are suitable for their intended use, they are subject to improvement. For example, current testing technologies do not provide the reactive part of the impedance when injecting load at variable frequencies to a DC-DC system. The present teachings advantageously provide a single unit that is capable of injecting resistive and reactive types of loads onto a switching DC-DC power supply to measure its robustness and design performance. Additional advantages of the present teachings are set forth herein.

SUMMARY

This section provides a general summary of the disclosure, and is not a comprehensive disclosure of its full scope or all of its features.

The present teachings provide for a single device that is capable of injecting resistive and reactive types of loads onto a switching DC-DC power supply to measure its robustness and design performance. The device can switch capacitive and inductive loads in addition to the resistive loads in order to simulate real-world loads accurately. This will allow the user to switch more options of loads and test power supply designs to gather more information about the system design. The device can be used to test any suitable power supply, such as power supplies for automotive systems. The device can be used to test any other suitable power supply as well.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of select embodiments and not all possible implementations, and are not intended to limit the scope of the present disclosure.

Figure 1:
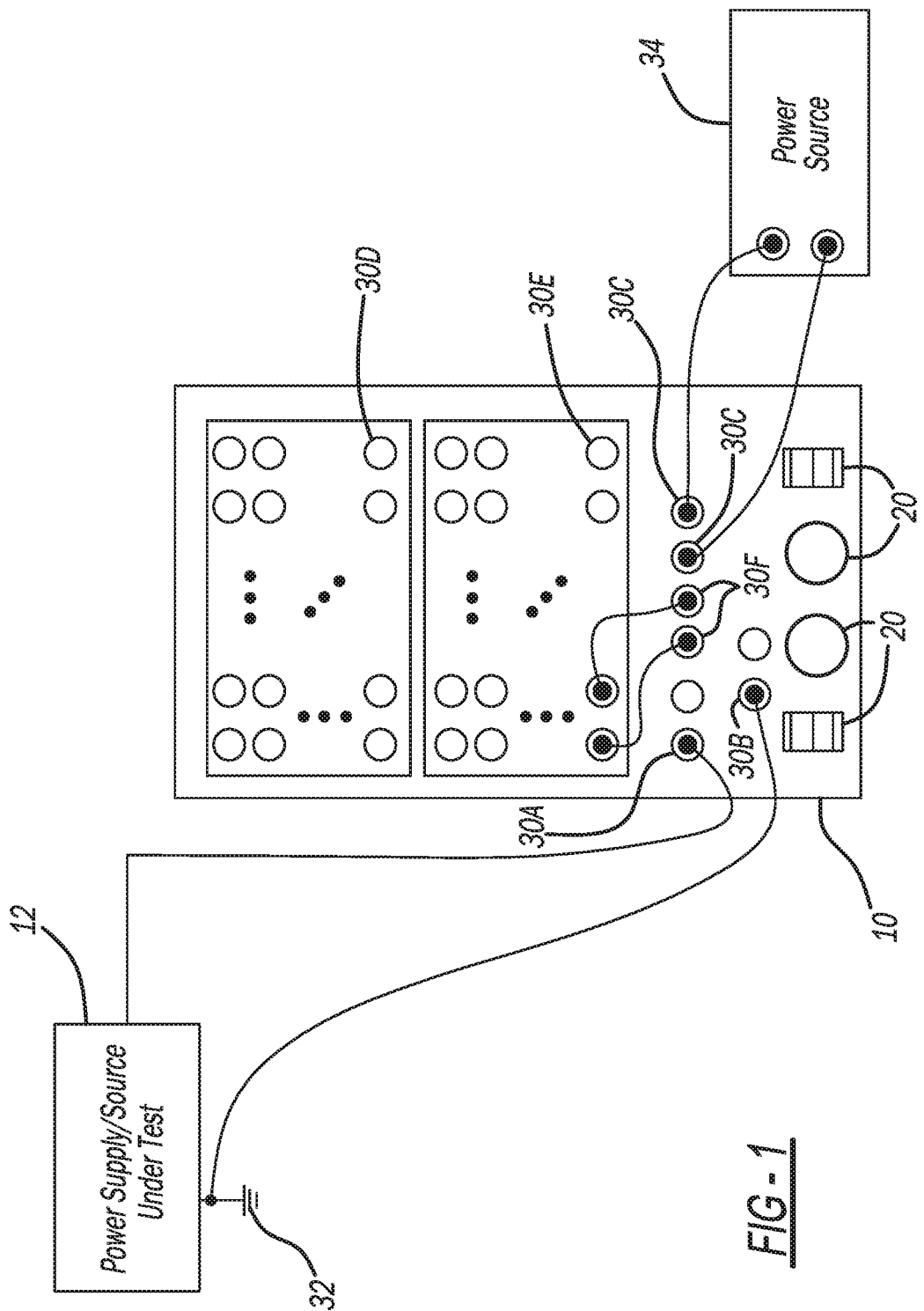
Figure 2:
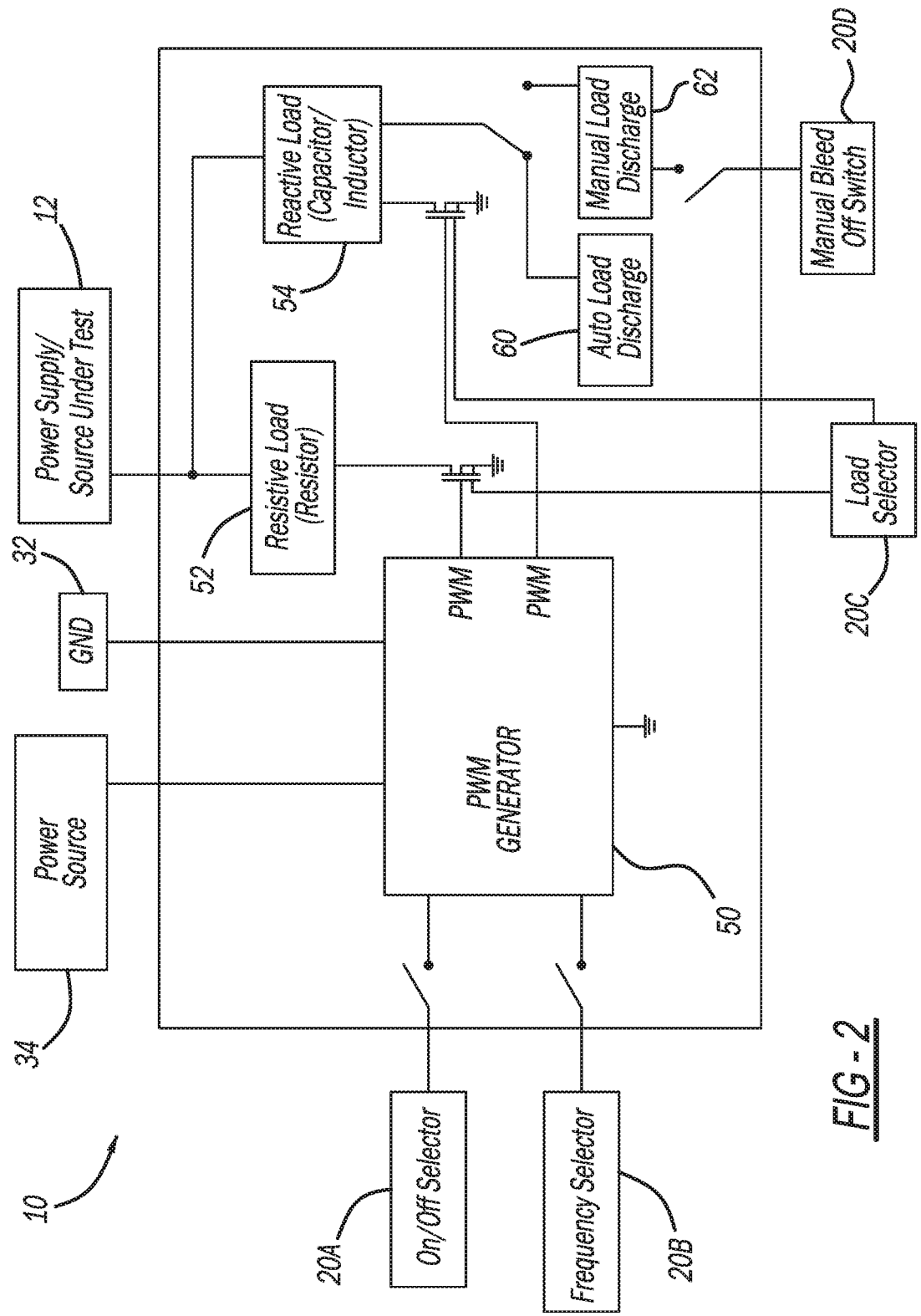

FIG. 1 illustrates a device in accordance with the present teachings for testing a power supply by injecting both active and reactive loads to the power supply; and FIG. 2 illustrates various components of the device of FIG. 1.

Corresponding reference numerals indicate corresponding parts throughout the several views of the drawings.

DETAILED DESCRIPTION

Example embodiments will now be described more fully with reference to the accompanying drawings.

With initial reference to FIG. 1, a testing device in accordance with the present teachings is illustrated at reference numeral 10. The testing device 10 is a DC-DC switching power supply load tester for testing the robustness of any suitable power supply or source under test 12, such as any suitable DC-DC, AC-DC, DC-AC, AC-AC, or LDO source. The power supply or source under test 12 can be, for example, any suitable automotive electronics power supply, or a power supply for any other suitable application, such as televisions, personal computers, or cellular telephones.

The testing device 10 can be provided in a plurality of different configurations, such as the configuration of FIG. 1. In the example of FIG. 1, the testing device 10 is a portable testing device having a housing or casing with a plurality of switches, knobs, and/or selectors 20 for operating the testing device 10. The plurality of switches, knobs, and/or selectors 20 can include a discharge switch 20 for activating a discharge network including an auto load discharge network 60 and/or a manual load discharge network 62, which are described herein and illustrated in FIG. 2. The testing device 10 also has a plurality of external contacts, such as contacts 30A-30F. The contacts are any suitable electrical contact or connection for connecting the testing device 10 as explained herein. For example, contact 30A provides an electrical connection to the power supply under test 12, and contact 30B provides an electrical contact to ground 32. Contacts 30C provide electrical contacts for connecting the testing device 10 to any suitable power supply 34 for powering the testing device 10. In some applications, the power supply 34 can be incorporated within the testing device 10, such as in the form of a battery for example.

The testing device 10 further includes a plurality of resistive load contacts 30D and reactive load contacts 30E. As explained further herein, the testing device 10 is able to apply a resistive load to the power supply under test 12 by connecting the resistive load contacts 30D to contacts 30F of the testing device 10. The testing device 10 is also able to apply a reactive load to the power supply under test 12 by connecting the reactive load contacts 30E to the contacts 30F. The connection between the resistive load contacts 30D or the reactive load contacts 30E and the contacts 30F can be provided as illustrated in FIG. 1. Alternatively, the device 10 can be configured to apply the resistive load 52 or the reactive load 54 to the power supply 12 in any other suitable manner. For example, the loads 52 and 54 can be applied by using any switching configuration, such as a switching configuration within the device 10.

With continued reference to FIG. 1 and additional reference to FIG. 2, additional features of the testing device 10 will now be described. As illustrated in FIG. 2, the switches, knobs, and selectors 20 can include an on/off selector 20A for turning the testing device 10 on and off. The testing device 10 further includes a pulse-width-modulation (PWM) generator 50. A frequency selector 20B can be included for selecting the frequency generated by the PWM generator 50 of the testing device 10. The frequency selector 20B can be a rotatable knob, for example. Any suitable load selector 20C can be included for selecting the resistive load 52 or the reactive load 54. A manual bleed-off switch 20D may also be included. The PWM generator 50 is connected to the power supply under test 12 and the ground 32. The PWM generator 50 thus introduces pulse-width-modulation to the circuit including the power supply under test 12.

The resistive load generator 52 can include a plurality of resistors for applying a resistive load to the circuit including the power supply under test 12. The resistive load 52 may be applied in any other suitable manner as well. The reactive load generator 54 applies a reactive load to the circuit including the power supply under test 12. The reactive load 54 can be applied in any suitable manner, such as with a plurality of capacitors or inductors. Using the load selector 20C, a user of the testing device 10 can selectively apply the resistive load 52 or the reactive load 54 to the power supply under test 12 in order to more completely test the power supply 12.

The testing device 10 further includes a load discharge network in the form of an auto load discharge network 60 and/or a manual load discharge network 62, which are selectively connected to the reactive load 54. The auto load discharge 60 and the manual load discharge 62 can be any suitable load discharge network for discharging the capacitors or inductors of the reactive load generator 54 so that the reactive load generator 54 is fully discharged between cycles so that the power supply under test 12 is subjected to the same load at every cycle during operation. The manual load discharge 62 can be manually operated using the manual bleed off switch 20D, or automatically activated after each cycle.

The present teachings thus advantageously provide for the testing device 10, which is a single enclosed unit in the example illustrated. The testing device 10 advantageously has a break-out array for reactive 54 (capacitive and inductive) and resistive 52 load banks for the user to physically build a load from. The break-out array can be either electrically or manually controlled. The load selector 20C allows the user to turn on or off resistive loads 52 and reactive loads 54, and the user can select switching frequencies using the frequency selector 20B. The auto load discharge 60 and the manual load discharge 62 advantageously allow the capacitors/inductors of the reactive load 54 to be fully discharged between cycles so that the power supply under test 12 is subjected to the same load at every cycle during operation. The testing device 10 is thus advantageously capable of selectively inducing a resistive load 52 and a reactive load 54 to a DC-DC system to more accurately measure the robustness and design performance of the power supply under test 12. Thus the testing device 10 advantageously simulates real world loads more accurately as compared to testing devices that are only able to apply resistive loads.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A device for testing a power supply under test, the device comprising:
   a resistive load generator configured to generate a resistive load for introduction to the power supply under test;
   a reactive load generator configured to generate a reactive load for introduction to the power supply under test;
   a modulation generator configured to introduce the resistive load and the reactive load to the power supply under test by way of pulse-width modulation through a connection between the modulation generator and the power supply under test; and a load selector for selectively applying at least one of the resistive load and the reactive load to the power supply under test.

2. The device of claim 1, wherein the power supply under test is one of a DC-DC power supply, a DC-AC power supply, an AC-DC power supply, an AC-AC power supply, and a linear regulator.

3. The device of claim 1, further comprising a frequency selector for selecting frequency of the modulation generator.

4. The device of claim 1, wherein the resistive load generator includes a plurality of resistors.

5. The device of claim 1, wherein the reactive load generator includes a plurality of capacitors.

6. The device of claim 1, wherein the reactive load generator includes a plurality of inductors.

7. The device of claim 1, further comprising a discharge network that discharges the reactive load between test cycles.

8. The device of claim 7, wherein the discharge network is an automatic discharge network.

9. The device of claim 7, wherein the discharge network is a manual discharge network.

10. The device of claim 7, further comprising a discharge switch for activating the discharge network.

11. A device for testing a power supply under test, the device comprising:

a resistive load generator including a plurality of resistors configured to generate a resistive load for introduction to the power supply under test;

a reactive load generator configured to generate a reactive load for introduction to the power supply under test;

a modulation generator configured to introduce the resistive load and the reactive load to the power supply under test by way of pulse-width modulation through a connection between the modulation generator and the power supply under test;

a discharge network that discharges the reactive load between test cycles;

a load selector for selectively applying at least one of the resistive load and the reactive load to the power supply under test; and a frequency selector for selecting frequency of the modulation generator.

12. The device of claim 11, wherein the reactive load generator includes a plurality of capacitors.

13. The device of claim 11, wherein the reactive load generator includes a plurality of inductors.

14. The device of claim 11, wherein the discharge network is an automatic discharge network.

15. The device of claim 11, wherein the discharge network is a manual discharge network.

16. The device of claim 11, further comprising a discharge switch for activating the discharge network.

17. The device of claim 11, further comprising a housing including the modulation generator, the resistive load generator, the reactive load generator, the discharge network, the load selector, and the frequency selector.

18. The device of claim 17, further comprising a power source for the device included within the housing.

19. The device of claim 11, further comprising a connection to a power source for powering the device.

20. The device of claim 11, further comprising a manual bleed off.

* * * * *

UNITED STATES PATENT AND TRADEMARK OFFICE
CERTIFICATE OF CORRECTION

PATENT NO.         : 10,598,737 B2
APPLICATION NO.    : 15/723718
DATED              : March 24, 2020
INVENTOR(S)        : Tom Szawarski et al.

Page 1 of 1

It is certified that error appears in the above-identified patent and that said Letters Patent is hereby corrected as shown below:

On the Title Page

Item (73) Assignee, Line 1: Delete "Intetnational" and insert --International-- therefor Signed and Sealed this
Ninth Day of June, 2020

Andrei Iancu
*Director of the United States Patent and Trademark Office*